United States Patent
Kim (10) Patent No.: US 6,535,051 B2
(45) Date of Patent: Mar. 18, 2003

(54) CHARGE PUMP CIRCUIT

(75) Inventor: Kyu-hyoun Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/861,954

(22) Filed: May 21, 2001

(65) Prior Publication Data

US 2001/0052811 A1 Dec. 20, 2001

(30) Foreign Application Priority Data

Jun. 9, 2000 (KR) .............................. 00-31664

(51) Int. Cl.$^7$ ................................. G05F 1/10
(52) U.S. Cl. .................. 327/536; 327/535; 327/157
(58) Field of Search ............................... 327/108, 110, 327/111, 112, 374, 376, 377, 536, 157, 148, 537; 326/87, 83, 86

(56) References Cited

U.S. PATENT DOCUMENTS

| | | | |
|---|---|---|---|
| 5,473,283 A | | 12/1995 | Luich .............................. 331/8 |
| 5,629,641 A | * | 5/1997 | Cheng .......................... 327/108 |
| 5,646,563 A | * | 7/1997 | Kou .............................. 327/157 |
| 5,734,297 A | * | 3/1998 | Bezera ......................... 327/112 |
| 5,945,855 A | | 8/1999 | Momtaz ....................... 327/157 |
| 6,160,432 A | * | 12/2000 | Rhee et al. .................. 327/157 |

FOREIGN PATENT DOCUMENTS

| | | | |
|---|---|---|---|
| KR | 1999-023644 | 3/1999 | ............ H03L/7/08 |
| KR | 1999-023916 | 3/1999 | ............ H03D/3/00 |

OTHER PUBLICATIONS

Poulton, John W., et al.. "Digital System Engineering". Cambridge University Press, 1998, pp. 626–627.

* cited by examiner

*Primary Examiner*—Tuan T. Lam
*Assistant Examiner*—Hiep Nguyen
(74) *Attorney, Agent, or Firm*—Mills & Onello LLP (57) ABSTRACT

A charge pump circuit capable of preventing coupling and charge injection without increasing a layout area and power consumption is provided. The charge pump circuit includes a pull-up current source, a pull-down current source, a first switching device, and a second switching device. The pull-up current source sources pump-up current to the output node. The pull-down current source includes a current mirror and sinks pump-down current from the output node. In particular, the first switching device is connected between a supply voltage node and the pull-up current source and is switched in response to a pump-up control signal. The second switching device is connected between the second current source and a ground voltage node and is switched in response to a pump-down control signal. The current pump circuit may further include a first dummy capacitor one end of which is connected to a junction between the first switching device and the first current source and a second dummy capacitor one end of which is connected to a junction between the second switching device and the second current source.

17 Claims, 5 Drawing Sheets

CHARGE PUMP CIRCUIT

BACKGROUND OF THE INVENTION

1. Field of the Invention

The present invention relates to a semiconductor integrated circuit, and more particularly, to a charge pump circuit adopted in a delay locked loop (DLL) or a duty cycle correction circuit.

2. Description of the Related Art

Charge pump circuits are used as integrators when a node of a circuit needs to be charged to a predetermined voltage level. When a charge pump circuit is used in a DLL, the charge pump circuit serves to receive a pump-up control signal or a pump-down control signal and integrate them. When a charge pump circuit is used in a duty cycle correction circuit, the charge pump circuit receives a clock signal to integrate a logic "high" interval of the clock signal with a negative (or positive) slope and integrate a logic "low" interval of the clock signal with a positive (or negative) slope. If a duty cycle of the clock signal is on the order of 50%, a constant voltage is output, if a duty cycle is below 50%, an increasing (or decreasing) voltage is output, and if a duty cycle is over 50%, a decreasing (or increasing) voltage is output.

Various types of charge pump circuits have been developed, and representative charge pump circuits are introduced by John W. Poulton in, "Digital System Engineering", pp. 626–627, Cambridge University Press, 1998. Furthermore, U.S. Pat. No. 5,473,283 titled "Cascode Switched Charge Pump Circuit" issued to Thomas M. Luich on Dec. 5, 1995 discloses improved charge pump circuits.

Figure 1:
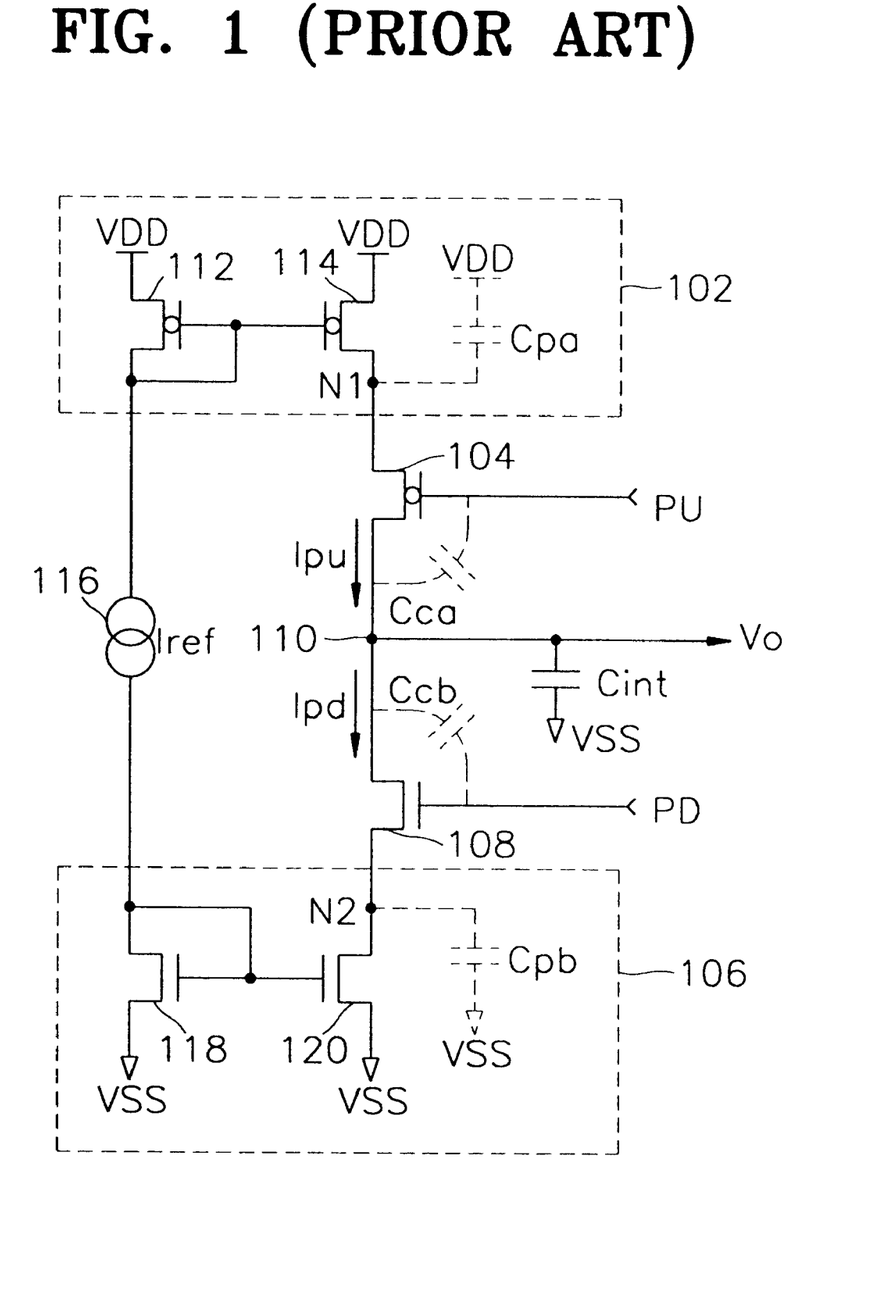
FIG. 1 is a circuit diagram showing an example of a conventional charge pump circuit.

FIG. 1 is a circuit diagram showing an example of a conventional charge pump circuit of the type disclosed in "Digital System Engineering" and. U.S. Pat. No. 5,473,283. The conventional charge pump circuit shown in FIG. 1 includes a pull-up current source 102, a first switching device 104 connected between the pull-up current source 102 and an output node 110. The switching device 104 is switched in response to a pump-up control signal PU. A second switching device 108 is connected between the output node 110 and a pull-down current source 106 and is switched in response to a pump-down control signal PD. A reference current source 116 provides a reference current Iref, and an integration capacitor Cint is connected to the output node 110 for integrating a current flowing through the output node 110 to change the current into a voltage.

The pull-up current source 102 includes a current mirror composed of PMOS transistors 112 and 114, and the pull-down current source 106 includes a current mirror composed of NMOS transistors 118 and 120. The first switching device 104 and the second switching device 108 are formed of a PMOS transistor and an NMOS transistor, respectively. However, the conventional charge pump circuit shown in FIG. 1 has a problem in that a coupling effect occurs due to overlap gate-to-drain capacitance Cca of the first switching device 104 and overlap gate-to-drain capacitance Ccb of the second switching device 108. The coupling effect refers to coupling of a signal of the output node 110, i.e., waveform of an output signal $V_O$, due to overlap capacitances Cca and Ccb as the level values of a pump-up control signal PU and a pump-down control signal PD are changed.

Furthermore, the conventional charge pump circuit shown in FIG. 1 has a problem in that charge injection occurs due to parasitic capacitance Cpa existing at a junction N1 between the pull-up current source 102 and the first switching device 104, and parasitic capacitance Cpb existing at a junction N2 between the pull-down current source 106 and the second switching device 108. Specifically, as the first switching device 104 is turned on or off, the level of the junction N1 discontinuously swings from a power voltage VDD to an output voltage $V_O$ or vice versa. Furthermore, as the second switching device 108 is turned on or off, the level of the junction N2 discontinuously swings from a ground voltage VSS to the output voltage $V_O$ or vice versa. In this case, charges are injected from the parasitic capacitances Cpa and Cpb, and the injected charges are shared with the integration capacitor Cint. This effect is referr d to as charge injection.

The presence of coupling and charge injection may result in integration errors. In the conventional charge pump circuit shown in FIG. 1, if one or more cycles of pump-up and pump-down control signals PU and PD lapse, coupling does not exist but charge injection still remains.

Figure 2:
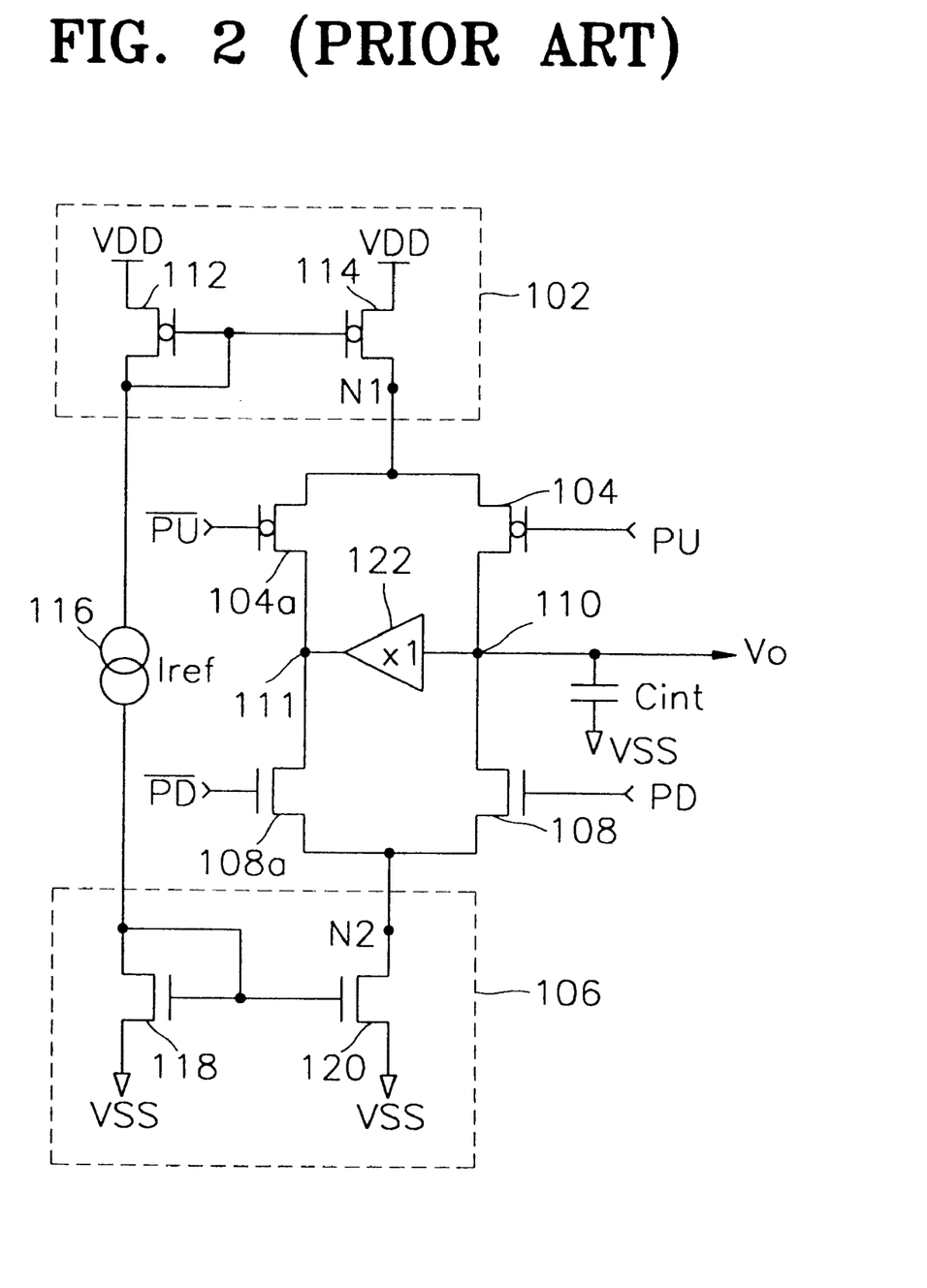
FIG. 2 is a circuit diagram showing another example of a conventional charge pump circuit.

FIG. 2 is a circuit diagram showing another example of a conventional charge pump circuit of the type disclosed in "Digital System Engineering", which is intended to prevent the charge injection effect. In addition to components of the charge pump circuit of FIG. 1, the conventional charge pump circuit shown in FIG. 2 further includes a switching device 104a connected between the pull-up current source 102 and compensating output node 111 and switched in response to an inverted signal $\overline{PU}$ of the pump-up control signal, a switching device 108a connected between the compensating output node 111 and the pull-down current source 106 and switched in response to an inverted signal $\overline{PD}$ of the pump-down control signal, and a unity gain buffer 122 the input terminal of which is connected to the output node 110 and the output terminal of which is connected to the compensating output node 111.

In the conventional charge pump circuit shown in FIG. 2, the voltage of the compensating output node 111and that of the output node 110 are made equal by the unity gain buffer 122. Furthermore, since either the switching device 104 or the switching device 104a and either the switching device 108 or the switching device 108a are always turned on, the levels of the junction N1 and the junction N2 do not swing discontinuously. Accordingly, this can prevent the possibility of charge injection.

However, the charge pump circuit shown in FIG. 2 requires the ideal gain and offset of the unity gain buffer 122 and very quick response time. In other words, the output resistance of the unity gain buffer 122 must be quite small and the operation speed thereof must be very fast. Thus, to achieve these characteristics, the charge pump circuit has disadvantages in that the layout area of the unity gain buffer 122 is increased and a large amount of power is consumed.

SUMMARY OF THE INVENTION

To solve the above problems, it is an objective of the present invention to provide a charge pump circuit capable of preventing the coupling effect and charge injection without an increase in a layout area and power consumption.

Accordingly, to achieve the above objective, the present invention provides a charge pump circuit including an output node, a first current source for sourcing pump-up current to the output node, and a first switching device which is connected between a first reference voltage node and the first current source and is switched in response to a pump-up control signal. A second current source sinks pump-down current from the output node, and a second switching device is connected between the second current source and a second reference voltage node and is switched in response to a pump-down control signal.

The charge pump circuit further includes a first dummy capacitor one end of which is connected to a junction between the first switching device and the first current source, and a second dummy capacitor one end of which is connected to a junction between the second switching device and the second current source. The opposite ends of the first and second dummy capacitors are connected to an inverted version of the pump-up control signal and an inverted version of the pump-down control signal, respectively.

Preferably, the first current source includes a current mirror for providing the pump-up current depending on a predetermined reference current. The second current source includes a current mirror for providing the pump-down current depending on the predetermined reference current.

The present invention also provides a charge pump circuit including first through fourth current sources, first through fourth switching devices, and first through fourth dummy capacitors. The first current source sources first pump-up current to the first output node, and the second current source sinks first pump-down current from the first output node. The first switching device is connected between a supply voltage node and the first current source and is switched in response to a pump-up control signal, while the second switching device is connected between the second current source and a ground voltage node and is switched in response to a pump-down control signal. The third current source sources a second pump-up current to the second output node, and the fourth current source sinks a second pump-down current from the second output node. The third switching device is connected between the supply voltage node and the third current source and is switched in response to an inverted signal of the pump-up control signal, and the fourth switching device is connected between the fourth current source and the ground voltage node and is switched in response to an inverted signal of the pump-down control signal.

One end of the first dummy capacitor is connected to a junction between the first switching device and the first current source, while the other end is connected to an inverted version of the pump-up control signal. One end of the second dummy capacitor is connected to a junction between the second switching device and the second current source, while the other end is connected to an inverted version of the pump-down control signal. One end of the third dummy capacitor is connected to a junction between the third switching device and the third current source, while the other end is connected to an inverted version of the pump-up control signal. One end of the fourth dummy capacitor is connected to a junction between the fourth switching device and the fourth current source, while the other end is connected to an inverted version of the pump-down control signal.

Preferably, the first current source includes a current mirror for providing the first pump-up current depending on a predetermined reference current. The second current source includes a current mirror for providing the first pump-down current depending on the predetermined reference current. The third current source includes a current mirror for providing the second pump-up current depending on the predetermined reference current. The fourth current source includes a current mirror for providing the second pump-down current depending on the predetermined reference current.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 3:
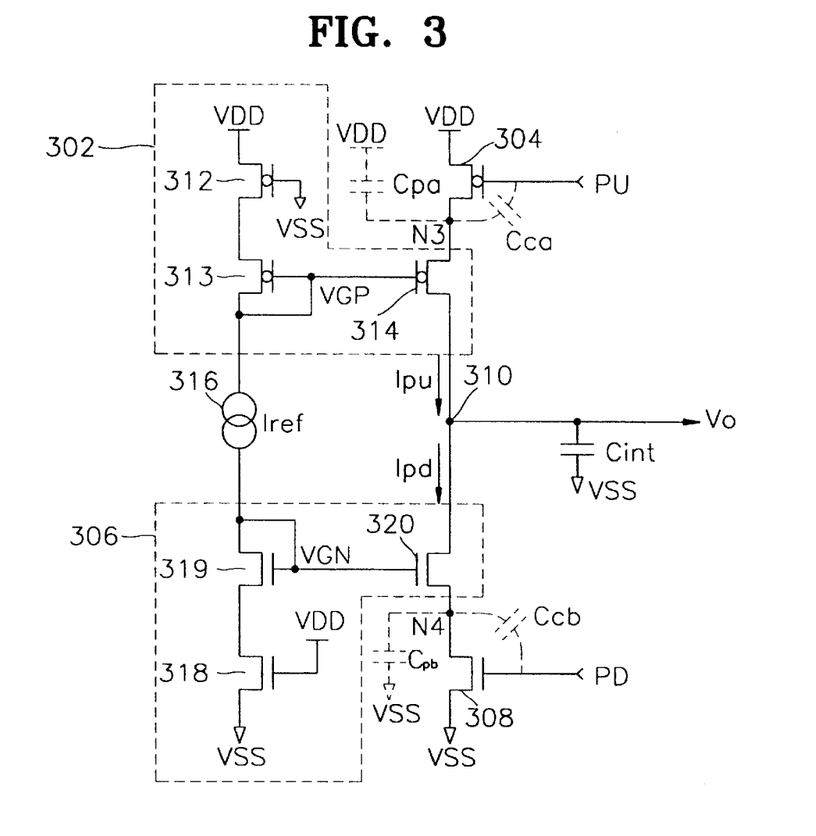
FIG. 3 is a circuit diagram of a charge pump circuit according to a first embodiment of the present invention.

Referring to FIG. 3, a charge pump circuit according to a first embodiment of the present invention includes a pull-up current source 302, a first switching device 304, a pull-down current source 306, a second switching device 308, an integration capacitor Cint, and a reference current source 316.

The pull-up current source 302 sources pump-up current Ipu to an output node 310 depending on predetermined reference current Iref that flows from the reference current source 316. The pull-up current source 302 includes a current mirror comprised of PMOS transistors 313 and 314, and a PMOS transistor 312 which is connected between the PMOS transistor 313 and a power voltage node VDD and to whose gate a ground voltage VSS is applied. The first switching device 304 comprised of, in one embodiment, a PMOS transistor, is connected between a power voltage VDD and the pull-up current source 302, and is switched in response to a pump-up control signal PU. The size of the PMOS transistor 312 is preferably the same as that of the PMOS transistor of the first switching device 304, and the size of the PMOS transistor 313 is preferably the same as that of the PMOS transistor 314.

The pull-down current source 306 sinks a pump-down current Ipd from the output node 310 depending on a predetermined reference current Iref that flows from the reference current source 316. The pull-down current source 306 includes a current mirror comprised of NMOS transistors 319 and 320, and an NMOS transistor 318 which is connected between the NMOS transistor 319 and a ground voltage node VSS and to whose gate a power voltage VDD is applied. The second switching device 308 comprised of, in one embodiment, an NMOS transistor, is connected between a ground voltage VSS and the pull-down current source 306, and is switched in response to a pump-down control signal PD. The size of the NMOS transistor 318 is preferably the same as that of the NMOS transistor of the second switching device 308, and the size of the NMOS transistor 319 is preferably the same as that of the NMOS transistor 320. The integration capacitor Cint is connected between the output node 310 and a ground voltage node VSS and integrates current flowing through the output node 310 to change the current into an output node signal $V_O$.

The operation of the charge pump circuit according to the first embodiment of the present invention will now be described with reference to FIG. 3. Here, it is assumed that the size of the PMOS transistor 312 is the same as that of the PMOS transistor of the first switching device 304 and that the size of the PMOS transistor 313 is the same as that of the PMOS transistor 314. Furthermore, it is assumed that the size of the NMOS transistor 318 is the same as that of the NMOS transistor of the second switching device 308, and that the size of the NMOS transistor 319 is the same as that of the NMOS transistor 320.

When a pump-up signal PU is logic "low", the resistance of the first switching device 304 becomes equal to that of the PMOS transistor 312, and a pump-up current Ipu having the same value as a reference current Iref is provided at the output node 310. signal $V_O$ output from the output node 310 is pulled-up accordingly. On the other hand, when the pump-up signal PU is logic "high", the first switching device 304 is turned off and the pump-up current Ipu becomes zero.

Similarly, when a pump-down control signal PD is logic "high", the resistance of the second switching device 308 becomes equal to that of the NMOS transistor 318, and a pump-down current Ipd having the same value as a reference current Iref is sinked from the output node 310. A signal $V_O$ output from the output node 310 is pulled-down accordingly. When the pump-down control signal PD is logic "low", the second switching device 308 is turned off and the pump-down current Ipd becomes zero.

Figure 4:
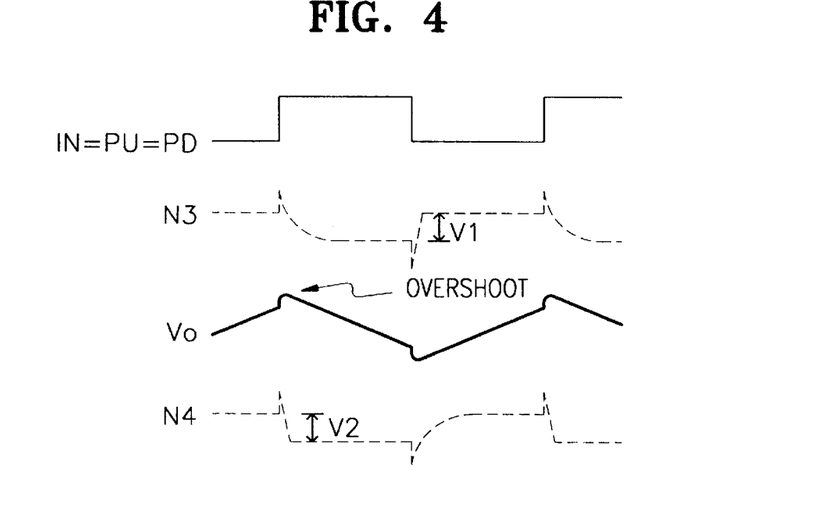
FIG. 4 is a waveform diagram of signals during operation of the charge pump circuit according to the first embodiment of the present invention.

FIG. 4 is a waveform diagram of signals during operation of the charge pump circuit according to the first embodiment of the invention shown in FIG. 3. Here, IN denotes pump-up and pump-down control signals PU and PD, where the pump-up control signal PU equals the pump-down control signal PD. Charge injection caused by parasitic capacitance Cpa existing at a junction N3 between the first switching device 304 and the pull-up current source 302, and a parasitic capacitance Cpb existing at a junction N4 between the second switching device 308 and the pull-down current source 306 will now be described as follows.

First, as the first switching device is turned on or off, the level of the junction N3 varies. For example, when the first switching device 304 is turned on, the level of the junction N3 is substantially a power voltage VDD and when the first switching device 304 is turned off, the level of the junction N3 has a value as expressed by the following Equation (1):

$$Vn3 = VGP + |VTP| \quad (1)$$

Here, VGP and VTP denote the gate voltage and threshold voltage of the PMOS transistor 314, respectively. In view of the fact that the PMOS transistor 312 is always turned off, VGP can be expressed by the following Equation (2).

$$VGP = VCC - VSG \quad (2)$$

Here, VCC and VSG denote a power voltage and a voltage between a source and a gate of the PMOS transistor 313, respectively. If Equation (2) is substituted into Equation (1), when the first switching device 304 is turned off, the level of the junction N3 has a value as expressed by the following Equation (3):

$$Vn3 = VCC - VSG + |VTP| \quad (3)$$

Therefore, a swing width V1 of the level of the junction N3 shown in the waveform diagram of FIG. 4 can be expressed by the following Equation (4):

$$V1 = VCC - (VCC - VSG + |VTP|) = VSG - |VTP| \quad (4)$$

Next, as the second switching device 308 is turned on or off, the level of a junction N4 varies. In other words, when the second switching device 308 is turned on, the level of the junction N4 is substantially a ground voltage VSS, i.e., 0 Volt, and when it is turned off, the level of the junction N4 has a value as expressed by the following Equation (5):

$$Vn4 = VGN - VTN \quad (5)$$

Here, VGN and VTN denote the gate voltage and threshold voltage of the NMOS transistor 320, respectively. Since the NMOS transistor 318 is always turned on, VGN can be expressed as the following Equation (6):

$$VGN = VGS \quad (6)$$

Here, VGS denotes a voltage between a gate and a source of the NMOS transistor 319. If Equation (6) is substituted into Equation (5), when the second switching device 308 is turned off, the level of the junction N4 has a value as expressed by the following Equation (7):

$$Vn4 = VGS - VTN \quad (7)$$

Thus, a swing width V2 of the level of the junction N4 shown in the waveform diagram of FIG. 4 can be expressed by the following Equation (8):

$$V2 = VGS - VTN \quad (8)$$

Finally, charge injection caused by swings of the levels of the junctions N3 and N4 can be expressed by the following Equation (9):

$$V1(\text{injection}) + V2(\text{injection}) = (VSG - |VTP|)*Cpa/(Cint+Cpa) - (VGS - VTN)*Cpb/(Cint+Cpb) \quad (9)$$

Here, V1(injection) and V2(injection) denote a charge injection due to a swing of the level of the junction N3 and a charge injection due to a swing of the level of the junction N4, respectively.

Thus, in the charge pump circuit according to the first embodiment of the invention, as can be seen in Equations (4) and (8), the swing width V1 of the level of the junction N3 and the swing width V2 of the level of the junction N4 are reduced compared with the conventional art. Furthermore, it can be seen in Equation (9) that charge injection is independent of an output signal $V_O$. Thus, in the charge pump circuit according to the first embodiment of the invention, charge injection can be removed by determining the sizes of the PMOS transistors 313 and 314 and the NMOS transistors 319 and 320 or by attaching dummy capacitance to the junction N3 or N4 to adjust values Cpa and Cpb so that the following Equation (10) may be formed. This means that an integration error due to the charge injection can be eliminated.

$$(VSG - |VTP|)/(VGS - VTN) = Cpb/Cpa \quad (10)$$

For example, when a transconductance parameter Kp of PMOS transistors is one half the a transconductance parameter Kn of NMOS transistors, if a channel width of the PMOS transistor 314 is determined as two times a channel width of the NMOS transistor 314, (VSG−|VTP|) becomes equal to (VSG−VTN). If an NMOS transistor whose size is the same as that of the NMOS transistor 320 and which is always turned off is attached to the junction N4, Cpa becomes equal to Cpb. In this case, charge injection expressed by Equation (10) becomes zero, thus an integration error caused by the charge injection can be removed.

Next, a coupling effect due to overlap capacitance Cca between gate and drain of the first switching device 304 and overlap capacitance Ccb between gate and drain of the second switching device 308 will be described. In the charge pump circuit shown in FIG. 3, the first switching device 304 is connected between a power voltage node VDD and the pull-up current source 302, and the second switching device 308 is connected between a ground voltage node VSS and the pull-down current source 306, so that as the levels of pull-up and pull-down control signals PU and PD are changed, the coupling caused by the overlap capacitances Cca and Ccb affects the junction N3 or N4.

Thus, as shown in the waveform diagram of FIG. 4, the moment the first switching device 304 changes from a turned-on state to a turned-off state, that is, the moment the signal IN goes from logic "low" to logic "high", the voltage level of the junction N3 is increased instantaneously by a coupling effect due to the overlap capacitance Cca. Accordingly, a current which is slightly larger than a reference current Iref flows through the PMOS transistor 314 and parasitic capacitance Cpa begins to be discharged. Thus, the voltage level of the junction N3 is reduced exponentially and the amount of a discharge current flowing through the PMOS transistor 314 is gradually reduced, so that the voltage level of the junction N3 is VGP+|VTP| as shown in Equation (1).

Also, the moment the first switching device 304 changes from a turned-off state to a turned-on state, that is, the moment the signal IN goes from logic "high" to logic "low", the voltage level of the junction N3 is instantaneously reduced by a coupling effect due to the overlap capacitance Cca. Since a voltage VDS between drain and source of the first switching device 304 is increased accordingly, a significantly large current flows through the first switching device 304, and the parasitic capacitance Cpa begins to be charged. The charging current, in this case, is fairly large so that the voltage level of the junction N3 is stabilized very quickly as shown in the waveform diagram of FIG. 4. Furthermore, since the operations when the second switching device 308 changes from a turned-on state to a turned-off state and vice versa is similar to the above operations, the detailed description thereof will be omitted.

As has been described above, when the first and second switching devices 304 and 308 change from a turned-on state to a turned-off state, the speed of stopping or shutting off a current of the PMOS transistor 314 is slow, thus, the waveform of an output signal $V_O$ is not linear, but causes a slight overshoot. In this case, if the shut-off operation speeds of the first and second switching devices 304 and 308 are different from each other, that is, if the values of Cpa and Cpb differ, this may cause an integration error.

Thus, in the charge pump circuit according to the first embodiment of the invention, the sizes of the PMOS transistors 313 and 314 and the NMOS transistors 319 and 320 are adjusted so that, the value Cpa is equal to the value Cpb, thereby preventing a coupling effect. Furthermore, as another means for preventing the coupling effect, a dummy coupling capacitor may be attached as shown in FIG. 5 so that overlap capacitances Cca and Ccb causing the coupling effect may be offset.

Figure 5:
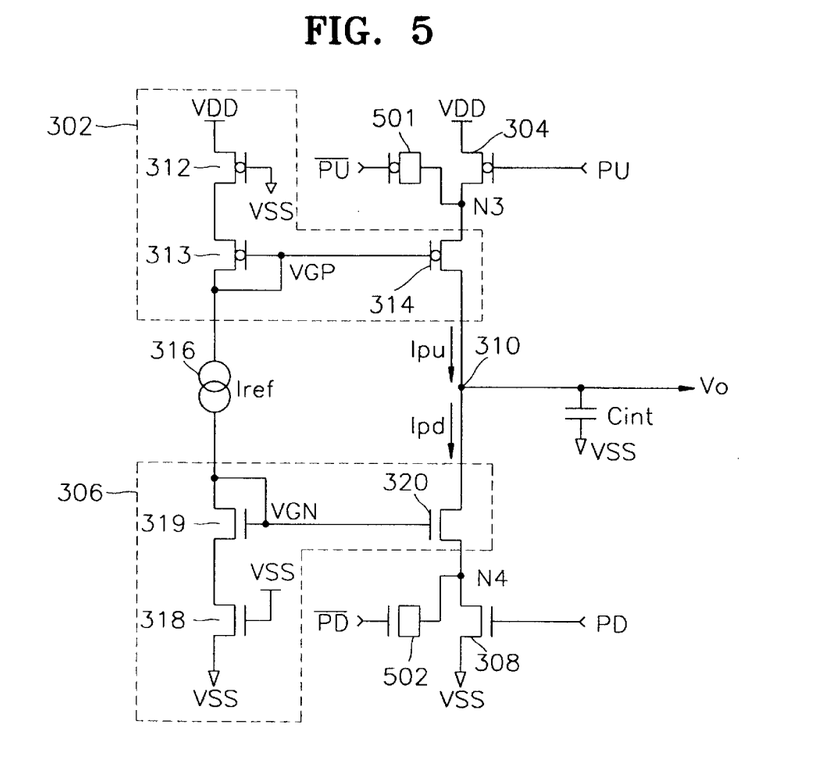
FIG. 5 is a circuit diagram of a charge pump circuit according to a second embodiment of the present invention.
Figure 6:
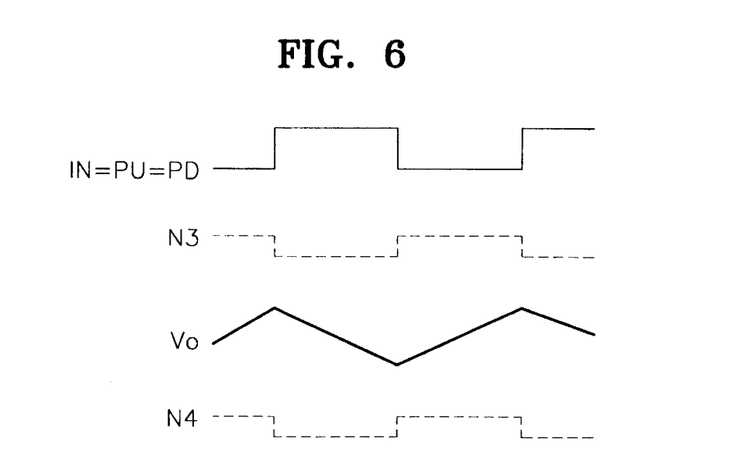
FIG. 6 is a waveform diagram of signals during operation of the charge pump circuit according to the second embodiment of the present invention.

FIG. 5 is a circuit diagram of a charge pump circuit according to a second embodiment of the invention, and FIG. 6 is a waveform diagram of signals during operation of the charge pump circuit according to the second embodiment of the invention shown in FIG. 5.

Referring to FIG. 5, the charge pump circuit according the second embodiment of the invention includes a pull-up current source 302, a first switching device 304, a pull-down current source 306, a second switching device 308, an integration capacitor Cint, and a reference current source 316, like the charge pump circuit according to the first embodiment. The charge pump circuit according to the second embodiment of the invention further includes a first dummy capacitor 501 one end of which is connected to a junction N3 between the first switching device 304 and the pull-up current source 302, and a second dummy capacitor 502 one end of which is connected to a junction N4 between the second switching device 308 and the pull-down current source 306.

The other end of the first dummy capacitor 501 is connected to an inverted signal $\overline{PU}$ of the pump-up control signal, and the other end of the second dummy capacitor 502 is connected to an inverted signal $\overline{PD}$ of the pump-down control signal. Thus, the charge pump circuit according to the second embodiment of the invention does not suffer from a coupling effect because overlap capacitances Cca and Ccb are offset by the first and second dummy capacitors 501 and 502. As shown in the waveform diagram of FIG. 6, the waveform of an output signal $V_O$ is linear without overshoot.

Figure 7:
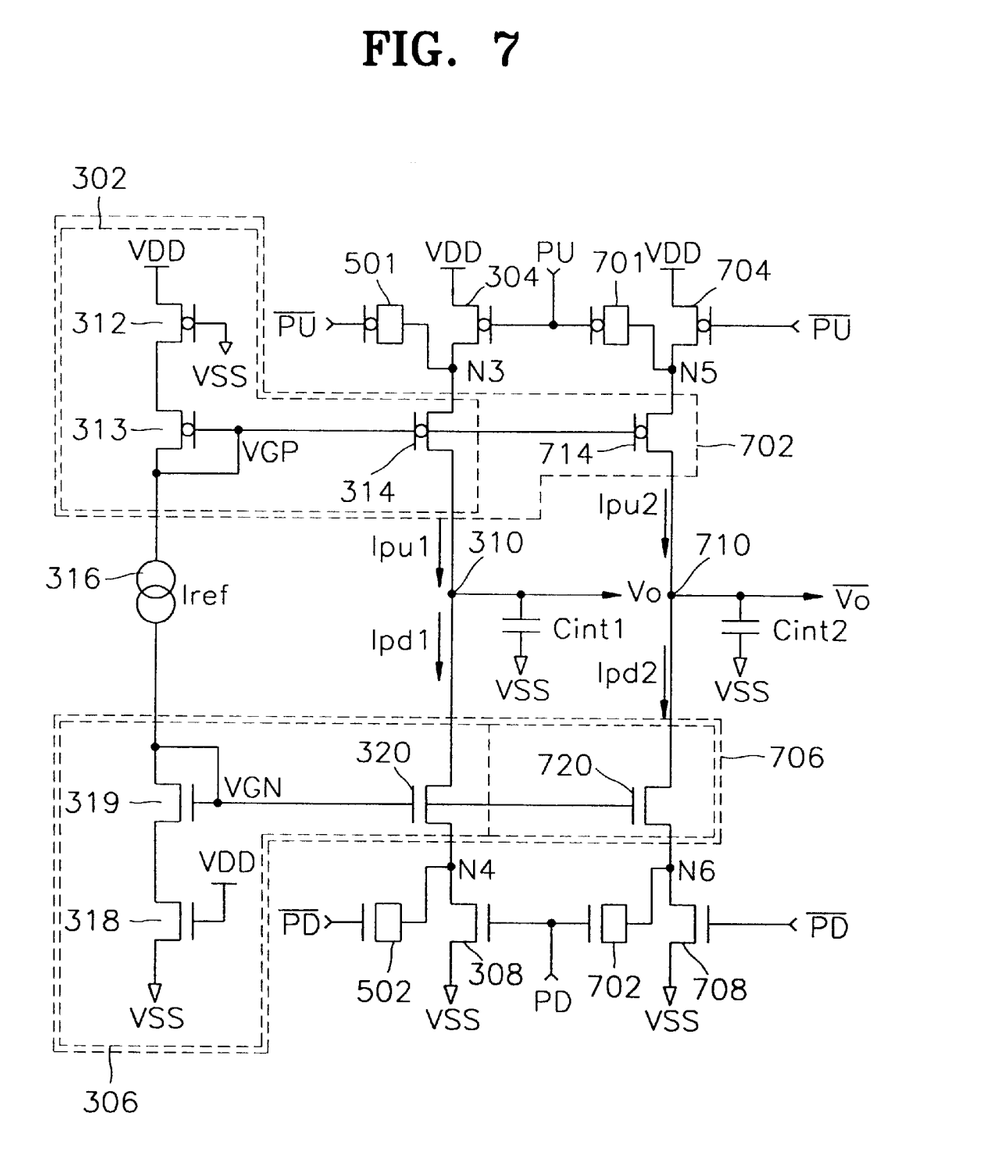
FIG. 7 is a circuit diagram of a circuit pump circuit according to a third embodiment of the present invention.

FIG. 7 is a circuit diagram of a charge pump circuit according to a third embodiment of the invention. Referring to FIG. 7, the charge pump circuit according to the third embodiment of the invention includes a first pull-up current source 302, a first switching device 304, a first pull-down current source 306, a second switching device 308, a first integration capacitor Cint1, a reference current source 316, a first dummy capacitor 501, and a second dummy capacitor 502. The charge pump circuit according to the third embodiment further includes a second pull-up current source 702, a third switching device 704, a second pull-down current source 706, a fourth switching device 708, a second integration capacitor Cint2, a third dummy capacitor 701, and a fourth dummy capacitor 702.

The second pull-up current source 702 sources pump-up current Ipu2 to an inverted output node 710 according to predetermined reference current Iref flowing from the reference current source 316. The second pull-up current source 702 includes a current mirror comprised of PMOS transistors 313 and 714 and a PMOS transistor 312. The third switching device 704 is comprised of a PMOS transistor, connected between a power voltage node VDD and the second pull-up current source 702 and switched in response to an inverted signal $\overline{PU}$ of the pump-up control signal. The size of the PMOS transistor in the third switching device 704 is preferably the same as that of a PMOS transistor in a first switching device 304, and the size of the PMOS transistor 714 is preferably the same as that of the PMOS transistor 313.

The second pull-down current 706 sinks pump-down current Ipd2 from the inverted output node 710 according to predetermined reference current Iref flowing from the reference current source 316. The pull-down current source 706 includes a current mirror comprised of NMOS transistors 319 and 720, and an NMOS transistor 318. The fourth switching device 708 is comprised of an NMOS transistor, and is connected between a ground voltage node VSS and the second pull-down current source 706 and switched in response to an inverted signal $\overline{PD}$ of the pump-down control signal. The size of the NMOS transistor in the fourth switching device 708 is preferably the same as that of an NMOS transistor in the second switching device 308, and the size of the NMOS transistor 720 is preferably the same as that of the NMOS transistor 319.

The second integration capacitor Cint2 is connected between the inverted output node 710 and a ground voltage node VSS, and integrates current flowing through the inverted output node 710 to change the current into the inverted voltage signal $\overline{Vo}$. The third dummy capacitor 701 is connected between a junction N5 between the third switching device 704 and the second pull-up current source 702, and a pump-up control signal PU. The fourth dummy capacitor 702 is connected between a junction N6 between the fourth switching device 708 and the second pull-down current source 706, and a pump-down control signal PD. Thus, the differential type charge pump circuit according to the third embodiment of the invention does not suffer from a coupling effect because overlap capacitances are offset by the first through fourth dummy capacitors 501, 502, 701, and 702.

As has been described in the foregoing, in a charge pump circuit according to the invention, a switching device controlled by a pump-up control signal PU or an inverted signal $\overline{PU}$ is connected between a power voltage node and a pull-up current source, and a switching device controlled by a pump-down control signal PD or an inverted signal $\overline{PD}$ is connected between a ground voltage node and a pull-down current source. This reduces the swing width of the levels of junctions N3 and N5 and the swing width of the levels of junctions N4 and N6, and makes charge injection independent of an output signal $V_O$.

Thus, charge injection can be removed by controlling the sizes of PMOS transistors of a pull-up current source or NMOS transistors of a pull-down current source or by attaching dummy capacitors to junctions N3 and N5 or junctions N4 and N6 to control parasitic capacitances Cpa and Cpb. Thus, an integration error due to charge injection can be removed.

Furthermore, in a charge pump circuit according to the invention, a coupling effect can be prevented by controlling the sizes of PMOS transistors of a pull-up current source and the sizes of NMOS transistors of a pull-down current source so that parasitic capacitances Cpa and Cpb may be equal to each other. A coupling effect can also be avoided by attaching dummy coupling capacitors to junctions N3 and N5, or junctions N4 and N6 and offsetting overlap capacitances Cca and Ccb. Thus, an integration error due to a coupling effect can be prevented.

Accordingly, a charge pump circuit according to the invention is able to prevent coupling and charge injection without increasing a layout area as well as power consumption.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A charge pump circuit comprising:
   an output node;
   a first current source for sourcing pump-up current to the output node;
   a first switching device connected between a first reference voltage node and the first current source and switched in response to a pump-up control signal;
   a second current source for sinking pump-down current from the output node;
   a second switching device connected between the second current source and a second reference voltage node, and switched in response to a pump-down control signal;
   a first dummy capacitor a first end of which is connected to a junction between the first switching device and the first current source;
   a second dummy capacitor a first end of which is connected to a junction between the second switching device and the second current source; and
   a reference current source connected between the first current source and the second current source for providing a reference current between the first current source and the second current source.

2. The charge pump circuit of claim 1, wherein second ends of the first and second dummy capacitors are connected to an inverted signal of the pump-up control signal and an inverted signal of the pump-down control signal, respectively.

3. The charge pump circuit of claim 1, wherein the first current source includes a current mirror for providing the pump-up current depending on a predetermined reference current.

4. The charge pump circuit of claim 1, wherein the second current source includes a current mirror for providing the pump-down current depending on a predetermined reference current.

5. The charge pump circuit of claim 1, wherein the first switching device includes a PMOS transistor having a source connected to the first reference voltage node, a gate to which the pump-up signal is applied, and a drain connected to the first current source.

6. The charge pump circuit of claim 1, wherein the second switching device includes an NMOS transistor having a drain connected to the second current source, a gate to which the pump-down control signal is applied, and a source connected to the second reference voltage node.

7. A charge pump circuit comprising:
   a first output node;
   a first current source for sourcing first pump-up current to the first output node;
   a first switching device connected between a first reference voltage node and the first current source, and switched in response to a pump-up control signal;
   a second current source for sinking first pump-down current from the first output node;
   a second switching device connected between the second current source and a second reference voltage node, and switched in response to a pump-down control signal;
   a second output node;
   a third current source for sourcing second pump-up current to the second output node;
   a third switching device connected between the first reference voltage node and the third current source, and switched in response to an inverted version of the pump-up control signal;
   a fourth current source for sinking second pump-down current from the second output node; and
   a fourth switching device connected between the fourth current source and the second reference voltage node, and switched in response to an inverted version of the pump-down control signal.

8. The charge pump circuit of claim 7, further comprising:
   a first dummy capacitor a first end of which is connected to a junction between the first switching device and the first current source;

a second dummy capacitor a first end of which is connected to a junction between the second switching device and the second current source;

a third dummy capacitor a first end of which is connected to a junction between the third switching device and the third current source; and a fourth dummy capacitor a first end of which is connected to a junction between the fourth switching device and the fourth current source.

9. The charge pump circuit of claim 8, wherein second ends of the first and second dummy capacitors are connected to an inverted version of the pump-up control signal and an inverted version of the pump-down control signal, respectively, and second ends of the third and fourth dummy capacitors are connected to the pump-up control signal and the pump-down control signal, respectively.

10. The charge pump circuit of claim 7, wherein the first current source includes a current mirror for providing the first pump-up current depending on a predetermined reference current.

11. The charge pump circuit of claim 7, wherein the second current source includes a current mirror for providing the first pump-down current depending on a predetermined reference current.

12. The charge pump circuit of claim 7, wherein the third current source includes a current mirror for providing the second pump-up current depending on a predetermined reference current.

13. The charge pump circuit of claim 7, wherein the fourth current source includes a current mirror for providing the second pump-down current depending on a predetermined reference current.

14. The charge pump circuit of claim 7, wherein the first switching device includes a PMOS transistor having a source connected to the first reference voltage node, a gate to which the pump-up control signal is applied, and a drain connected to the first current source.

15. The charge pump circuit of claim 7, wherein the second switching device includes an NMOS transistor having a drain connected to the second current source, a gate to which the pump-down control signal is applied, and a source connected to the second reference voltage node.

16. The charge pump circuit of claim 7, wherein the third switching device includes a PMOS transistor having a source connected to the first reference voltage node, a gate to which an inverted signal of the pump-up control signal is applied, and a drain connected to the third current source.

17. The charge pump circuit of claim 7, wherein the fourth switching device includes an NMOS transistor having a drain connected to the fourth current source, a gate to which an inverted signal of the pump-down control signal is applied, and a source connected to the second reference voltage node.

* * * * *